(12) United States Patent
Nagai et al.

(10) Patent No.: US 7,473,934 B2
(45) Date of Patent: Jan. 6, 2009

(54) SEMICONDUCTOR LIGHT EMITTING DEVICE, LIGHT EMITTING MODULE AND LIGHTING APPARATUS

(75) Inventors: Hideo Nagai, Takatsuki (JP); Kenji Mukai, Shijonawate (JP)

(73) Assignee: Panasonic Corporation, Osaka (JP)

( * ) Notice: Subject to any disclaimer, the term of this patent is extended or adjusted under 35 U.S.C. 154(b) by 224 days.

(21) Appl. No.: 10/565,342

(22) PCT Filed: Jul. 22, 2004

(86) PCT No.: PCT/JP2004/010760

§ 371 (c)(1),
(2), (4) Date: Jan. 20, 2006

(87) PCT Pub. No.: WO2005/013365

PCT Pub. Date: Feb. 10, 2005

(65) Prior Publication Data

US 2006/0180818 A1    Aug. 17, 2006

(30) Foreign Application Priority Data

Jul. 30, 2003    (JP) .............................. 2003-282664

(51) Int. Cl.
H01L 29/18    (2006.01)
H01L 33/00    (2006.01)
H01L 29/20    (2006.01)

(52) U.S. Cl. .............................. 257/89; 257/79; 257/99; 257/676; 257/E33.061; 257/E51.022; 438/28

(58) Field of Classification Search .................. 257/89, 257/E33.061, 79, 88, E51.002; 438/28
See application file for complete search history.

(56) References Cited

U.S. PATENT DOCUMENTS

| 4,047,069 | A | * | 9/1977 | Akutsu et al. | 313/487 |
| 4,857,801 | A | * | 8/1989 | Farrell | 313/500 |
| 5,795,798 | A | | 8/1998 | Mishra et al. | |
| 6,212,213 | B1 | | 4/2001 | Weber et al. | |
| 6,465,809 | B1 | | 10/2002 | Furukawa et al. | |
| 6,468,821 | B2 | * | 10/2002 | Maeda et al. | 438/29 |
| 6,502,956 | B1 | * | 1/2003 | Wu | 362/237 |
| 6,577,073 | B2 | * | 6/2003 | Shimizu et al. | 315/246 |
| 6,692,136 | B2 | * | 2/2004 | Marshall et al. | 362/231 |
| 6,740,906 | B2 | * | 5/2004 | Slater et al. | 257/99 |
| 6,927,426 | B2 | * | 8/2005 | Matsuoka et al. | 257/103 |
| 2002/0072138 | A1 | | 6/2002 | Trezza et al. | |

FOREIGN PATENT DOCUMENTS

| EP | 1 160 883 A2 | 12/2001 |
| JP | 06-326364 | 11/1994 |
| JP | 07-288341 | 10/1995 |
| JP | 9-64420 | 3/1997 |
| JP | 2000-223745 | 8/2000 |
| JP | 2001-57441 | 2/2001 |
| JP | 2002-060747 | 2/2002 |
| JP | 2002-188084 | 7/2002 |

* cited by examiner

*Primary Examiner*—Kenneth A Parker
*Assistant Examiner*—John Lin

(57) ABSTRACT

An LED array chip (2) includes blue LEDs (6) and red LEDs (8). The blue LEDs (6) are formed by epitaxial growth on an SiC substrate (4). Bonding pads (46 and 48) are formed on the SiC substrate (4) in a wafer fabrication process. The red LEDs (8) are separately manufactured from the blue LEDs (6), and flip-chip mounted on the bonding pads (46 and 48) formed on the SiC substrate.

20 Claims, 15 Drawing Sheets

STEP A1

STEP B1

STEP C1

STEP D1

STEP E1

STEP F1

STEP G1

STEP H1

STEP I1

STEP A2

STEP B2

STEP C2

STEP D2

STEP E2

STEP F2

SEMICONDUCTOR LIGHT EMITTING DEVICE, LIGHT EMITTING MODULE AND LIGHTING APPARATUS

TECHNICAL FIELD

The present invention relates to a semiconductor light emitting device, a light emitting module, and a lighting apparatus. The present invention particularly relates to a semiconductor light emitting device that combines light emitting members which emit light of different colors to emit light of a desired color by mixture of the colors of the light, and to a light emitting module and a lighting apparatus including this semiconductor light emitting device.

BACKGROUND ART

In the field of light emitting diodes (LEDs) which are one type of semiconductor light emitting devices, vigorous researches have recently been conducted to use white LEDs for lighting, as white LEDs with higher luminance have been developed. Having a feature of point light sources, LEDs are particularly expected to replace halogen lamps and the like that are conventionally used as spotlighting at shops, museums, and showrooms.

A white LED that is widely used at present includes a combination of a blue LED chip emitting blue light and a phosphor (e.g Ce:YAG) which is excited by the blue light to emit yellow light.

A color temperature of this white LED is 4000K at lowest because of a shortage of red components. Accordingly, the white LED is not suitable as an alternative light source for halogen lamps, which have a color temperature of 3000K.

The following part lists white LEDs which have sufficient red components and are known to be potentially able to realize a color temperature of 3000K or lower.

(1) A white LED including a combination of a purple LED chip (wavelength: 380 nm to 410 nm) and blue, green and red phosphors (e.g. Japanese unexamined patent application publication No. 2002-188084)

(2) A white LED including a combination of an ultraviolet LED chip (wavelength: less than 380 nm) and blue, green and red phosphors (3) A white LED including a combination of a blue LED chip and green and red phosphors (e.g. Japanese unexamined patent application publication No. 2002-60747)

(4) A white LED including a combination of blue, green and red LED chips (e.g. Japanese unexamined patent application publication No. H09-64420)

(5) A white LED including a combination of blue and red LED chips and a green phosphor (e.g. Japanese unexamined patent application publication No. 2000-223745)

Of the white LEDs (1) to (5), the white LEDs (1) to (3) each include a red phosphor. Since a red phosphor only has a low color conversion efficiency, these white LEDs have not yet been put into practical use in any technical fields.

The white LEDs (4) and (5) include a combination of LED chips which emit light of different colors. These white LEDs have not yet been put into practical use for lighting because of large unevenness of color that is caused for the following reason. The LED chips are generally mounted on a printed-wiring board in the white LEDs. On the printed-wiring board, the LED chips are inevitably arranged at large intervals, due to technical constraints in forming a wiring pattern by etching. As a result, the colors of light emitted from the LED chips do not mix together well.

To solve this problem, the printed-wiring board may be replaced with, for example, an SiC substrate which has a wiring pattern formed in a wafer fabrication process and can achieve high-density mounting. Even if such an SiC substrate is employed, however, a step of mounting all of the LED chips is still required.

It is not only white LEDs which have the above-mentioned problem of unevenness of color. This problem is common to all other types of semiconductor light emitting devices that combine light emitting members emitting light of different colors to emit light of a desired color.

In view of this problem, a first object of the present invention is to provide a semiconductor light emitting device that includes a combination of light emitting members emitting light of different colors and can achieve both less unevenness of color and higher productivity.

A second object of the present invention is to provide a light emitting module and a lighting apparatus using the above semiconductor light emitting device.

DISCLOSURE OF THE INVENTION

The first object can be achieved by a semiconductor light emitting device including a substrate; a first light emitting member that is formed on the substrate in an epitaxial growth step of a wafer fabrication process; an electrically conductive pattern that is formed on the substrate in a wiring step of the wafer fabrication process; and a second light emitting member that is separately formed and then mounted on the electrically conductive pattern. Here, the second light emitting member emits light of a different color from the first light emitting member. According to this construction, the second light emitting member is mounted on the electrically conductive pattern that is formed in the wiring step. This enables high-precision (high-density) arrangement of the second light emitting member and the first light emitting member that is formed in the epitaxial growth step on the substrate. As a consequence, the colors of the light emitted from the first and second light emitting members mix together better, and unevenness of color can be therefore reduced. At the same time, a step of mounting the first light emitting member on the substrate can be omitted, which can improve productivity of a manufacturing process of the semiconductor light emitting device.

The second object can be achieved by using the above-described semiconductor light emitting device. For the same reasons stated above, less unevenness of color along with higher productivity can be achieved.

BRIEF DESCRIPTION OF THE DRAWINGS

FIG. 10A illustrates the LED module after removing a lens and the like.

BEST MODE FOR CARRYING OUT THE INVENTION

The following describes an embodiment of the present invention with reference to the attached drawings.

Figure 1A:
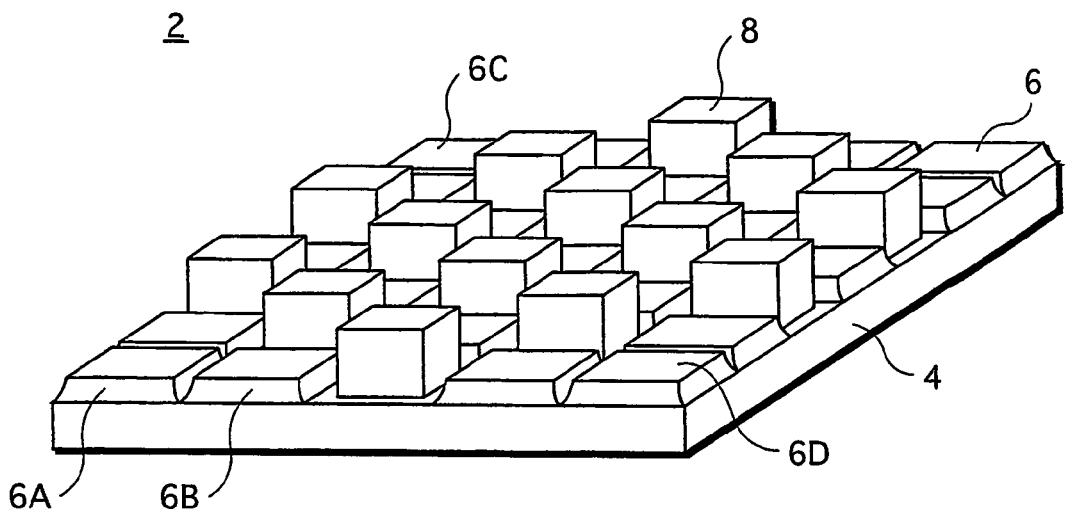
FIG. 1A is a perspective view illustrating an LED array chip.
Figure 1B:
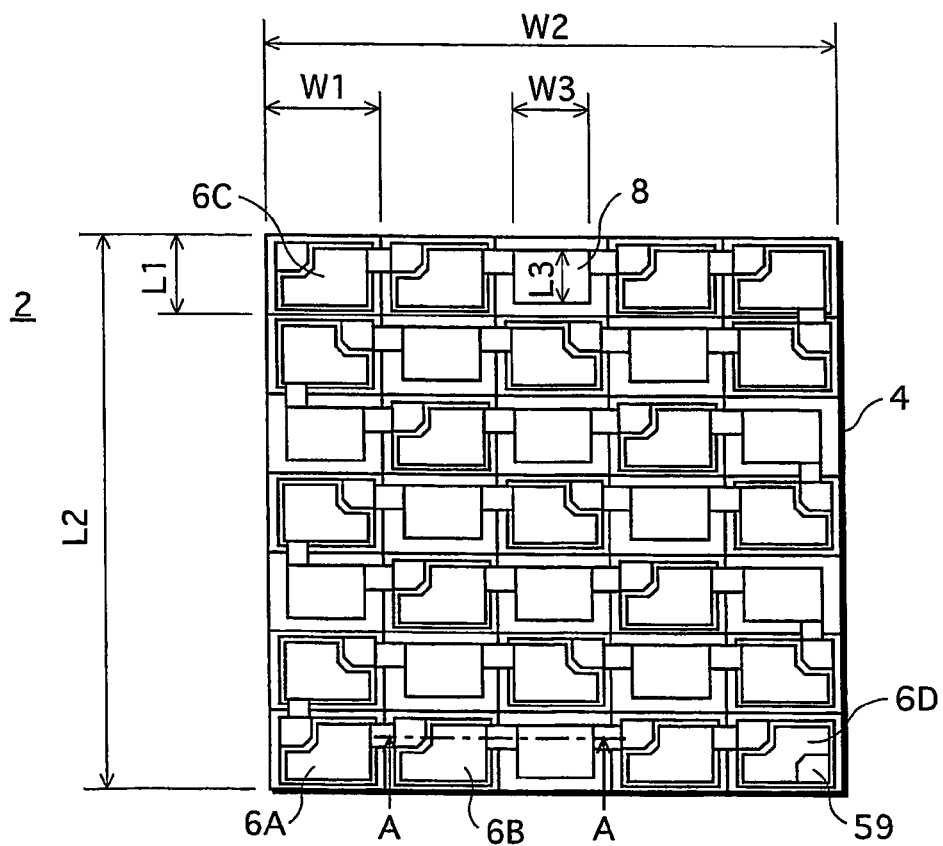
FIG. 1B is a plan view illustrating the LED array chip.

FIG. 1A is an external perspective view that illustrates a construction of an LED array chip 2 which is one type of a semiconductor light emitting device. FIG. 1B is a plan view illustrating the LED array chip 2. FIG. 1A mainly shows how blue LEDs 6 and red LEDs 8 are arranged, and therefore does not show minute depressions and protrusions on surfaces of the blue and red LEDs 6 and 8 in the LED array chip 2. It should be noted that a reduced scale for each constituent is not uniform in any of the drawings including FIGS. 1A and 1B.

As shown in FIGS. 1A and 1B, the LED array chip 2 is formed in such a manner that light emitting elements (LEDs 6 and 8) are arranged in a matrix of N rows and M columns (in the present embodiment, a matrix of seven rows and five columns, in total, 35 LEDs) on a non-doped (highly resistive) SiC substrate 4 which is a semiconductor substrate (hereinafter simply referred to as "an SiC substrate 4").

In FIG. 1A, LEDs 8 that are slightly higher than the other LEDs 6 are red LEDs. The LED array chip 2 includes 14 red LEDs 8. The other LEDs 6 are blue LEDs. The LED array chip 2 includes 21 blue LEDs 6. As mentioned in detail later, the blue LEDs 6 are formed by epitaxial growth on the SiC substrate 4. The red LEDs 8 are first separately manufactured as bare chips, and then mounted on the SiC substrate 4. A size L1×W1 of each blue LED 6 is 285 μm×400 μm. A size L2×W2 of the LED array chip 2 is 2 mm×2 mm. A size L3×W3 of each red LED 8 is 250 μm×350 μm.

Figure 2A:
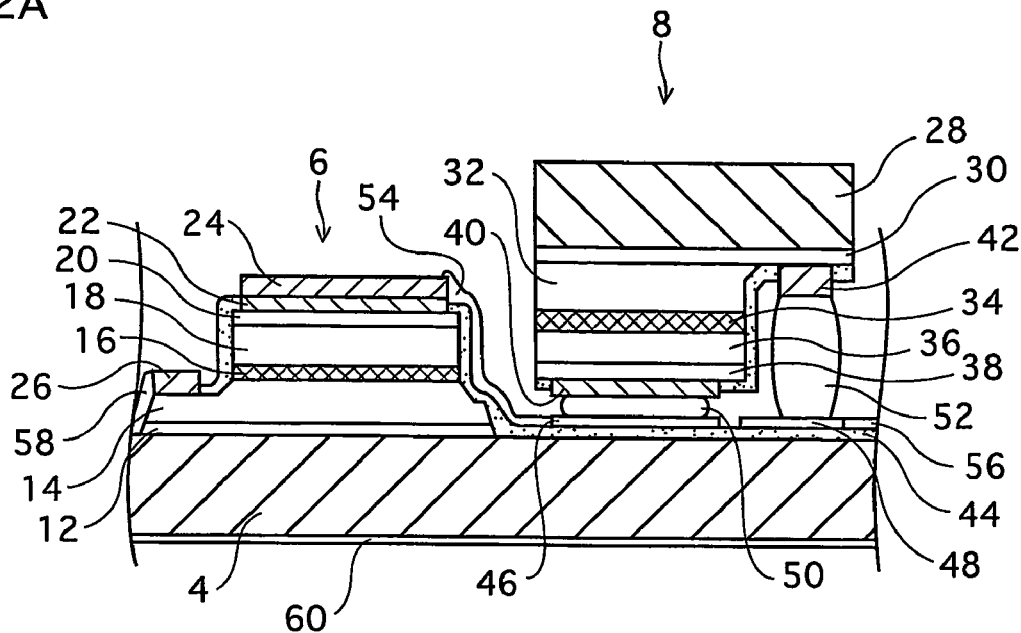
FIG. 2A a cross-sectional view illustrating a part of the LED array chip.

The following part describes a construction of each of the blue LED 6 and the red LED 8 with reference to a cross-sectional view in FIG. 2A.

FIG. 2A illustrates a cross-section along a line AA shown in FIG. 1B.

The blue LED 6 is made up of an n-AlGaN buffer layer 12 (having a thickness of 30 nm), an n-GaN clad layer 14 (having an Si-doping amount of $3 \times 10^{18}$ cm$^{-3}$ and a thickness of 2 μm), an InGaN/GaN multiple quantum well (MQW) light emitting layer 16 composed of six periods of InGaN (having a thickness of 2 nm)/GaN (having a thickness of 8 nm), a p-GaN clad layer 18 (having an Mg-doping amount of $3 \times 10^{19}$ cm$^{-3}$ and a thickness of 200 nm), and a p-GaN contact layer 20 (having an Mg-doping amount of $3 \times 10^{19}$ cm$^{-3}$ and a thickness of 200 nm). These layers 12, 14, 16, 18, and 20 are formed on the SiC substrate 4 in the stated order.

An Ni/Au thin film 22 and an ITO transparent electrode 24 are formed on the p-GaN contact layer 20 in this order. A Ti/Au electrode 26 is formed on the n-GaN clad layer 14.

When power is supplied to this blue LED 6 through the ITO transparent electrode 24 and the Ti/Au electrode 26, the light emitting layer 16 emits blue light having a wavelength of 460 nm. The reason for using the Ni/Au thin film 22 and the ITO transparent electrode 24 in the present embodiment is to improve transmission of the light emitted from the light emitting layer 16.

The red LED 8 is flip-chip mounted on the SiC substrate 4. The red LED 8 is made up of a p-GaInP contact layer 30 (having a Zn-doping amount of $1 \times 10^{18}$ cm$^{-3}$ and a thickness of 200 nm), a p-Al$_{0.5}$In$_{0.5}$P clad layer 32 (having a Zn-doping amount of $1 \times 10^{18}$ cm$^{-3}$ and a thickness of 600 nm), an Al$_{0.03}$Ga$_{0.47}$In$_{0.5}$P/Al$_{0.1}$Ga$_{0.4}$In$_{0.5}$P MQW light emitting layer 34 composed of five periods of Al$_{0.03}$Ga$_{0.47}$In$_{0.5}$P (having a thickness of 3 nm)/Al$_{0.1}$Ga$_{0.4}$In$_{0.5}$P (having a thickness of 5 nm), an n-Al$_{0.5}$In$_{0.5}$P clad layer 36 (having an Si-doping amount of $1 \times 10^{18}$ cm$^{-3}$ and a thickness of 1.5 μm), and an n-GaInP contact layer 38 (having an Si-doping amount of $1 \times 10^{18}$ cm$^{-3}$ and a thickness of 200 nm). These layers 30, 32, 34, 36, and 38 are formed on an InP substrate 28 in the stated order.

An Ni/Al electrode 40 is formed on the n-GaInP contact layer 38, and an Ni/Au electrode 42 is formed on the p-GaInP contact layer 30.

When power is supplied to this red LED 8 through the Ni/Al electrode 40 and the Ni/Au electrode 42, the light emitting layer 34 emits red light having a wavelength of 625 nm. The Ni/Al electrode 40 reflects the light emitted from the light emitting layer 34 towards the InP substrate 28. This improves light extraction efficiency.

In a position where each red LED 8 is to be mounted on the SiC substrate 4, a pair of bonding pads 46 and 48 are provided on an Si$_3$N$_4$ film 44, which is an insulating film (layer). To mount the red LED 8, the Ni/Al electrode 40 is connected with the bonding pad 46 by means of an Au bump 50, and the Ni/Au electrode 42 is connected with the bonding pad 48 by means of an Au bump 52. Since the red LED 8 is flip-chip mounted, the light emitting layer 34 is located closer to the SiC substrate 4. This makes it easier to dissipate heat generated from the light emitting layer 34 to the SiC substrate 4. Having a higher heat conductivity than a metal, the SiC substrate 4 can efficiently conduct heat generated in the blue LEDs 6 and the red LEDs 8 to a ceramics substrate 202 (mentioned later), to dissipate the heat.

Figure 2B:
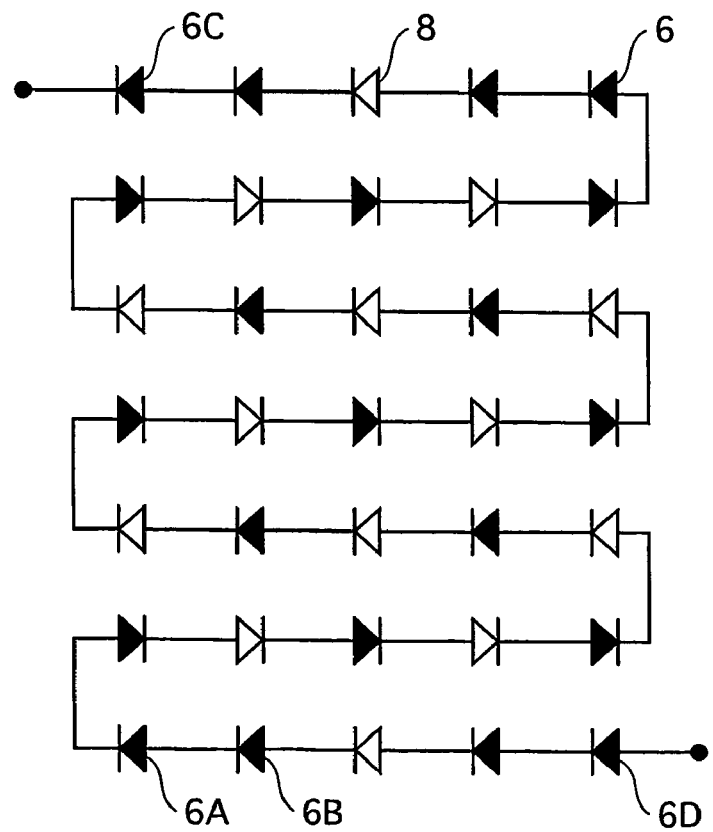
FIG. 2B illustrates how LEDs are connected to each other in the LED array chip.

A bridging wire 54 extending from the bonding pad 46 is connected to the ITO transparent electrode 24 of the blue LED 6. A bridging wire 56 extending from the bonding pad 48 is connected to a Ti/Au electrode of another blue LED adjacent to the red LED 8 (not shown in FIG. 2A). By use of the bridging wires 54 and 56, all of the 35 LEDs 6 and 8 are connected in series as shown in FIG. 2B. In FIG. 2B, the blue LEDs 6 are represented by black diode symbols, and the red LEDs 8 are represented by white diode symbols. When two blue LEDs 6 are horizontally adjacent to each other (e.g. blue LEDs 6A and 6B shown in FIG. 1A), an ITO transparent electrode 24 of the blue LED 6A is connected to a Ti/Au electrode 26 of the blue LED 6B by a bridging wire 58 (see FIG. 2A).

The bridging wires 54, 56 and 58 and the bonding pads 46 and 48 are formed in a wafer fabrication process as described later. Therefore, the bridging wires 54, 56 and 58 and the bonding pads 46 and 48 can be highly precisely formed, when compared with a case where the constituents are formed by a technique such as etching on a printed-wiring board. This allows adjacent blue and red LEDs 6 and 8 to be formed closer to each other. As a consequence, since blue light emitted from the blue LEDs 8 mixes with red light emitted from the red LEDs 6 better, unevenness of color is reduced.

Among the blue LEDs 6 and the red LEDs 8 that are connected in series in the LED array chip 2, a blue LED 6C (see FIGS. 1A and 1B) is an LED on a lower potential end of the LED array chip 2. Therefore, a Ti/Au electrode of the blue LED 6C is a cathode electrode of the LED array chip 2. A blue LED 6D (see FIGS. 1A and 1B) is an LED on a higher potential end. Therefore, a Ti/Au bonding pad 59 (shown in FIG. 1B) formed on a part of an ITO transparent electrode 24 of the blue LED 6D is an anode electrode of the LED array chip 2. It is not the ITO transparent electrode 24 of the blue LED 6D which is the anode electrode. This is because the ITO transparent electrode 24 can not be properly connected to a bonding wire used to mount the LED array chip 2.

A Ti/Pt/Au film 60 is formed on the entire lower surface of the SiC substrate 4.

When a current of 50 mA is applied to the LED array chip 2 having the above-described construction through the anode electrode and the cathode electrode with heat dissipation being ensured, an operating voltage of 100 V is observed.

Figure 3:
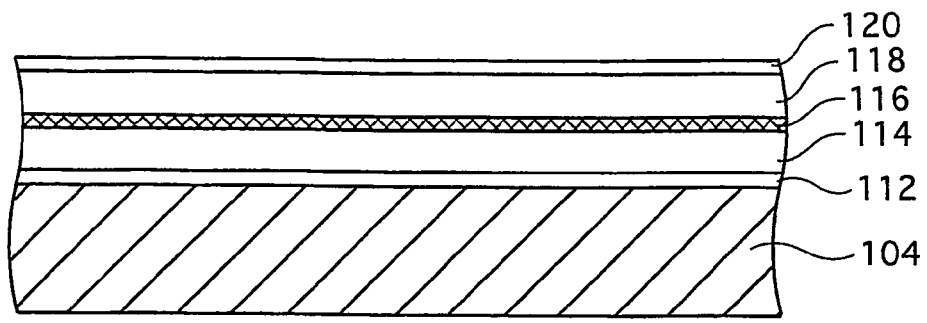
FIG. 3 illustrates part of a manufacturing method of the LED array chip.
Figure 3:
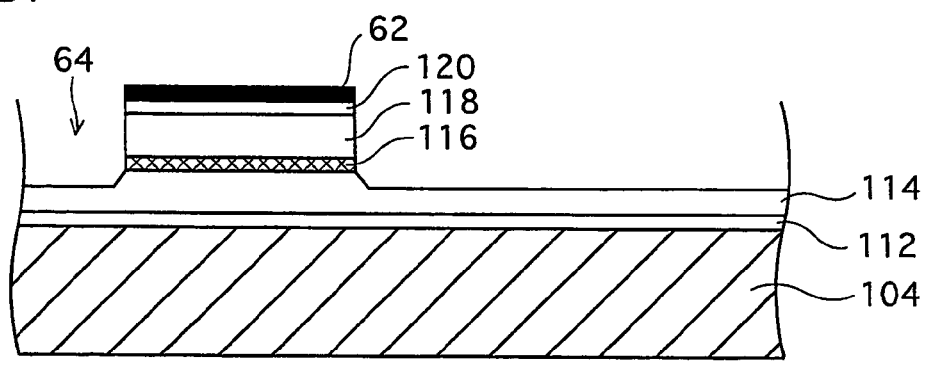
Figure 3:
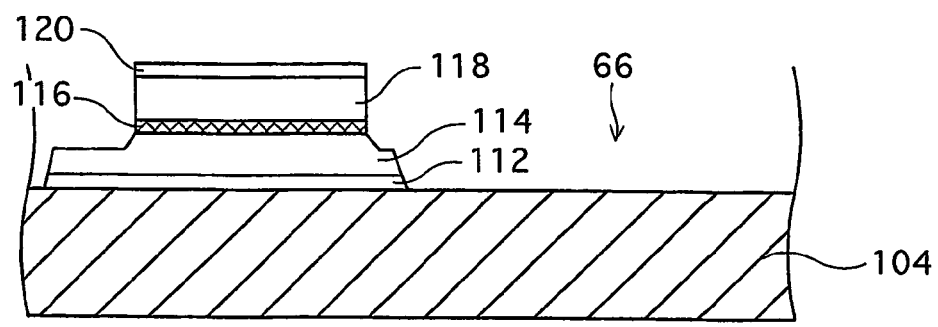
Figure 4:
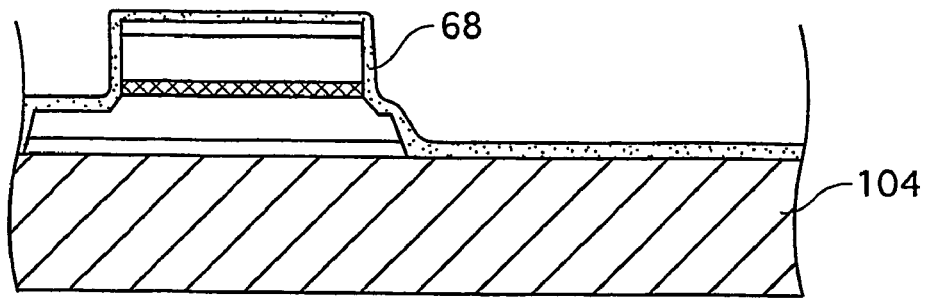
FIG. 4 illustrates part of the manufacturing method of the LED array chip.
Figure 4:
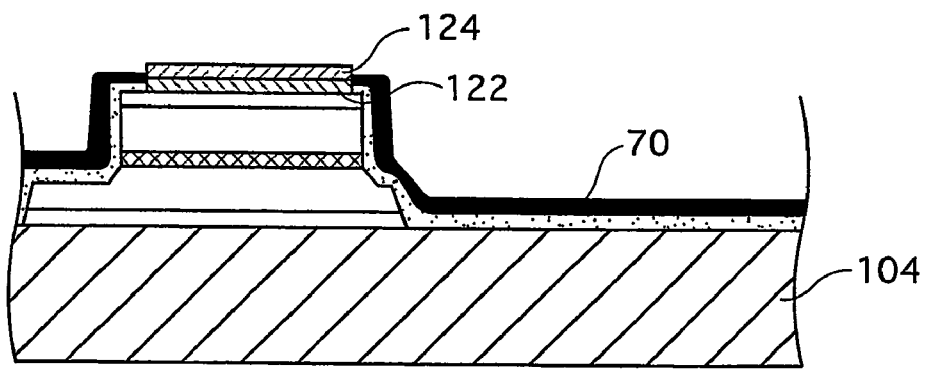
Figure 4:
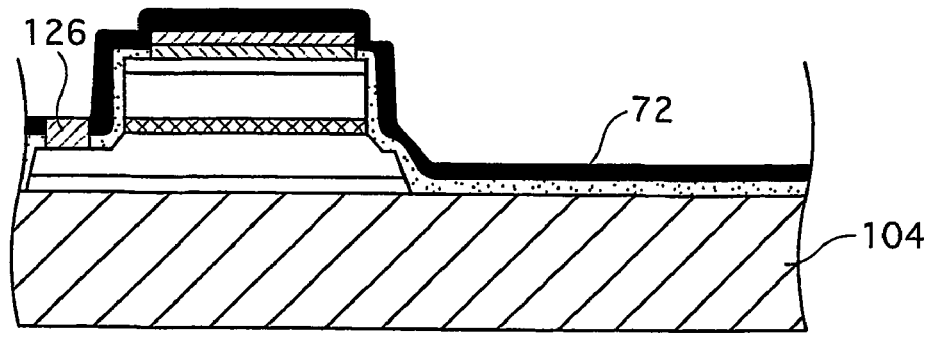
Figure 5:
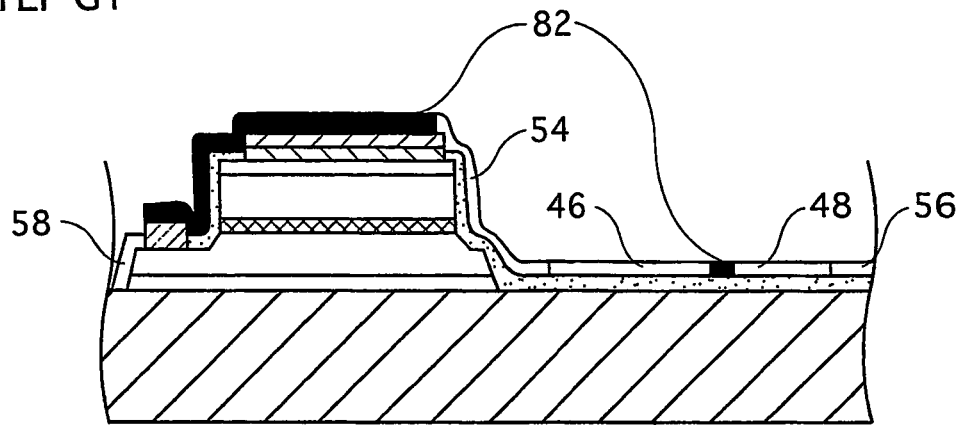
FIG. 5 illustrates part of the manufacturing method of the LED array chip.
Figure 5:
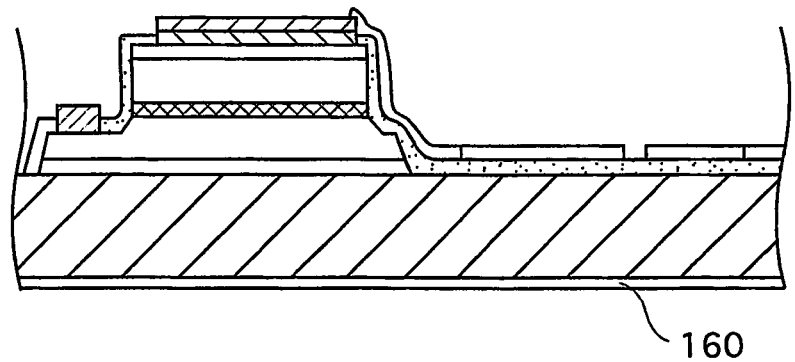
Figure 5:
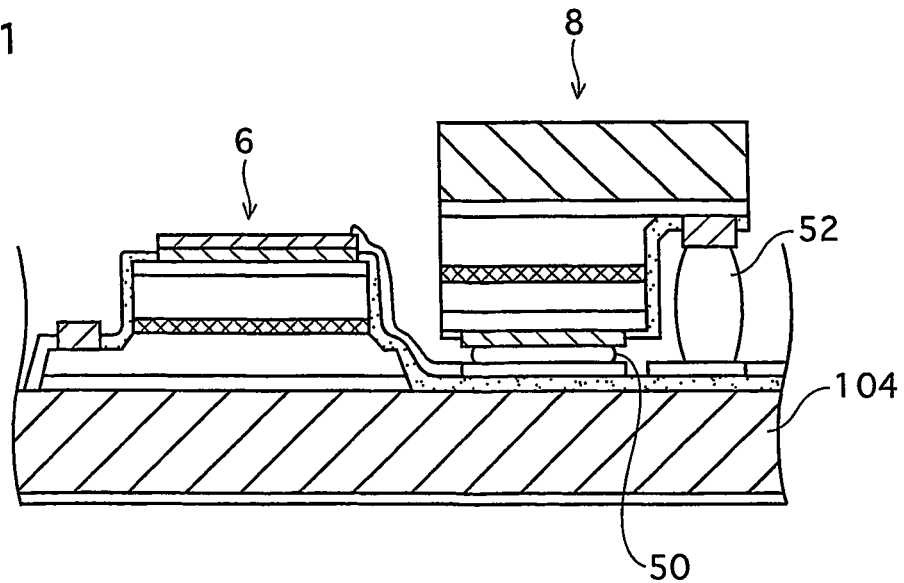

The following part describes a manufacturing method of the LED array chip 2 using a wafer fabrication process, with reference to FIGS. 3 to 5. In FIGS. 3 to 5, a material to form each constituent of the LED array chip 2 is identified by a three-digit number whose first digit is one. The last two digits of the three-digit number represents a reference numeral identifying the corresponding constituent of the LED array chip 2. The wafer fabrication process includes an epitaxial growth step of forming a multi-layer semiconductor film and a wiring step of forming an electrode, a pad, a wiring and the like.

Firstly, as shown in FIG. 3, an n-AlGaN buffer layer 112, an n-GaN clad layer 114, an MQW light emitting layer 116 composed of six periods of InGaN/GaN, a p-GaN clad layer 118, and a p-GaN contact layer 120 are formed on a non-doped SiC substrate 104 in the stated order using a metal organic chemical vapor deposition (MOCVD) method (step A1). Here, the non-doped SiC substrate 104 has a diameter of two inches and a thickness of 300 μm.

After this, a mask 62 is formed, so as to mask an area, on the lamination made up of the layers 120, 118, 116, 114 and 112, that is slightly larger than an area in which the Ni/Au thin film 22 (and the ITO transparent electrode 24) of each blue LED 6 is to be formed. An unmasked area of the lamination is removed by etching to a depth of approximately half of the thickness of the n-GaN clad layer 114 is removed (step B1). Thus, a surface to connect the Ti/Au electrode 26 (an electrode formation surface) 64 is formed. The mask 62 is removed prior to the next step.

A mask (not shown in FIG. 3) is next formed so as to mask an area in which each blue LED 6 is to be formed. An unmasked area of the remaining thickness of the layer 114 and the layer 112 is removed by etching to such a depth that a surface of the SiC substrate 104 is exposed (step C1). Thus, the lamination made up of the n-AlGaN buffer layer 112 to the p-GaN contact layer 120 is divided into individual blue LEDs 6, and areas (spaces) 66 for mounting the red LEDs 8 are created. Here, a predetermined interval is provided between blue LEDs 6 adjacent to each other horizontally and vertically. The mask is removed prior to the next step.

An Si$_3$N$_4$ film 68, which is an insulating film, is formed by sputtering or the like (step D1). The Si$_3$N$_4$ film 68 is provided for protecting a surface of the LED array chip 2 and insulating the bridging wires 54, 56 and 58 and bonding pads 46 and 48 from unnecessary constituents.

After this, a mask 70 is formed, so as to mask the Si$_3$N$_4$ film 68 except for an area in which the Ni/Au thin film 22 (and the ITO transparent electrode 24) of each blue LED 6 is to be formed. An unmasked area of the Si$_3$N$_4$ film 68 is removed by etching. After this, an Ni/Au thin film 122 and an ITO film 124 are formed by deposition, sputtering or the like. Thus, the Ni/Au thin film 22 and the ITO transparent electrode 24 for each blue LED 6 are formed (step E1). A portion of the lamination of the Ni/Au thin film 122 and the ITO film 124 which is formed on the mask 70 (not shown in FIG. 4) is removed together with the mask 70 prior to the next step.

The same procedure as the step E1 is performed to form the Ti/Au electrode 26 of each blue LED 6. Specifically speaking, a mask 72 is formed so as to mask the resulting surface after the step E1, except for an area on the Si$_3$N$_4$ film 68 in which the Ti/Au electrode 26 for each blue LED 6 is to be formed. After an unmasked area of the Si$_3$N$_4$ film 68 is removed by etching, a Ti/Au film 126, which is a thin metal film, is provided by deposition, to form the Ti/Au electrode 26 (step F1). A portion of the Ti/Au film 126 which is formed on the mask 72 (not shown in FIG. 4) is removed together with the mask 72 prior to the next step.

In the next step, the bridging wires 54, 56 and 58 and the bonding pads 46 and 48 are formed in the following manner. A mask 82 is formed so as to mask the resulting surface after the step F1, except for areas in which the bridging wires 54, 56 and 58 and the bonding pads 46 and 48 are to be formed. After this, a Ti/Pt/Au film, which is a thin metal film, is formed by deposition to form the bridging wirings 54, 56 and 58 and the bonding pads 46 and 48 (step G1). A portion of the Ti/Pt/Au film which is formed on the mask 82 (not shown in FIG. 5) is removed together with the mask 82 prior to the next step.

After this, a lower surface of the SiC substrate 104 is polished so that the thickness of the SiC substrate 104 becomes 150 μm. A Ti/Pt/Au film 160 is then formed on the lower surface by deposition (step H1).

In the next step, the red LED 8 is flip-chip mounted on the SiC substrate 104 by means of a capillary (not shown in FIG. 5). In detail, the red LED 8 is connected with the bonding pads 46 and 48 on the SiC substrate 104 by the Au bumps 50 and 52 respectively (step I1). Note that the red LED 8 is manufactured separately in a manner described later. As shown in FIG. 5, the red LED 8 is taller than the blue LED 6 by a length approximately equal to the thickness of the SiC substrate 104. As seen from FIGS. 1A and 1B, every LED adjacent to the red LED 8 in row and column directions is a blue LED 6. Accordingly, the red LEDs 8 can be easily mounted without the capillary interfering with adjacent LEDs. Red LEDs 8 may be adjacent to each other vertically and horizontally between two adjacent LED array chips 2 on the SiC substrate 104, as red LEDs 8 are arranged in outmost columns and rows of the matrix of seven rows and five columns. Here, a predetermined interval is provided, as a dicing margin, between the adjacent LED array chips 2. This solves the above-mentioned problem of capillary interfering between the adjacent red LEDs 8.

Lastly, the SiC substrate 104 is divided into individual LED array chips 2 by dicing. Thus, the LED array chip 2 shown in FIGS. 1A and 1B is manufactured.

There is another manufacturing method that achieves as high mounting density as the above-described manufacturing method. In detail, a wiring pattern and a bonding pad, which are included in an electrically conductive pattern, are first formed on an SiC substrate in a wafer fabrication process. Blue LEDs (LED chips) and red LEDs (LED chips) which are manufactured separately are then mounted on this SiC substrate. In this case, both blue and red LEDs must be mounted one by one. According to the present embodiment, however, since the blue LEDs 6 are formed on the SiC substrate 104 by epitaxial growth, the step of mounting the blue LEDs can be omitted. This achieves a reduction in a manufacturing cost, since the number of times the capillary shuttles can be reduced by 21, which is equal to the number of the blue LEDs 6, for each LED array chip 2.

Furthermore, the present embodiment can achieve a significantly higher relative location accuracy between adjacent blue LEDs 6 than the method of mounting the blue LEDs. As a consequence, when compared with the manufacturing method of mounting both blue and red LEDs, the present embodiment approximately doubles relative location accuracy between the blue and red LEDs 6 and 8, thereby achieving a reduction in unevenness of color.

Figure 6:
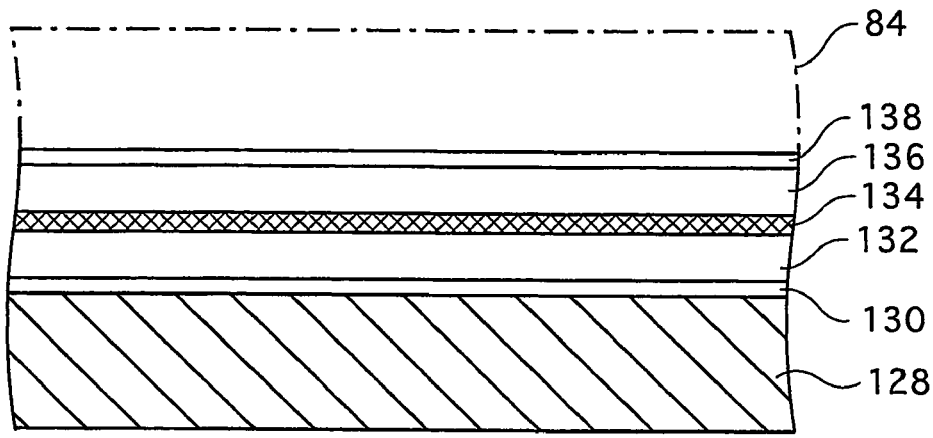
FIG. 6 illustrates part of a manufacturing method of a red LED included in the LED array chip.
Figure 6:
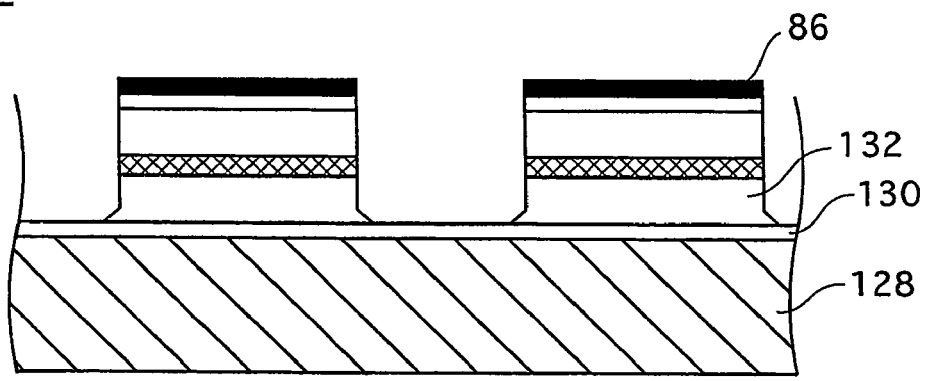
Figure 6:
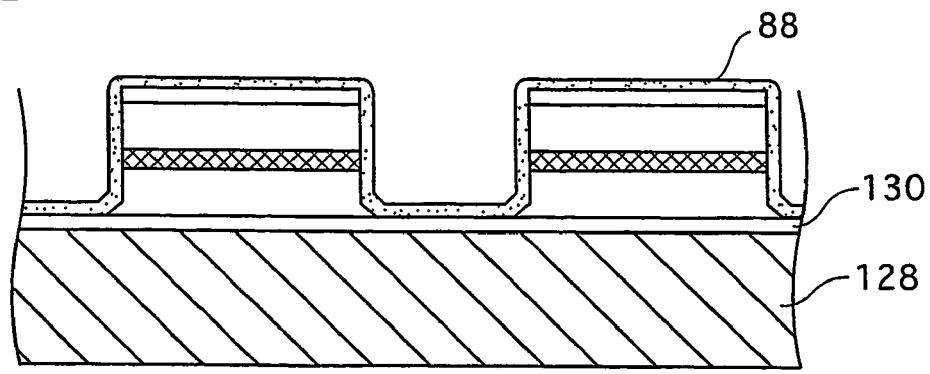
Figure 7:
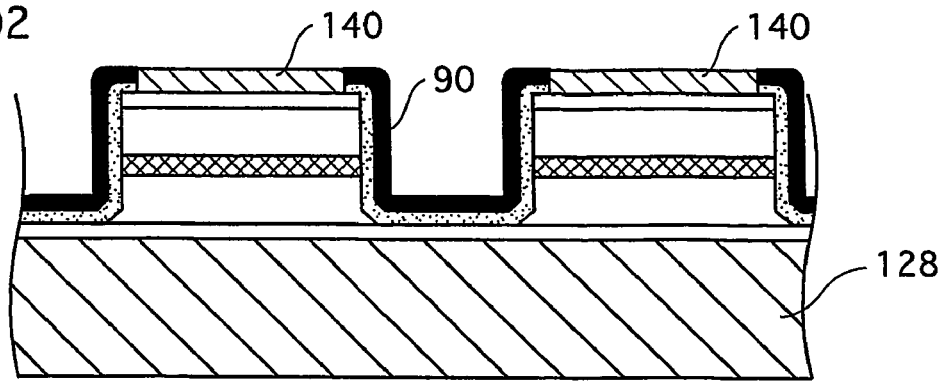
FIG. 7 illustrates part of the manufacturing method of the red LED included in the LED array chip.
Figure 7:
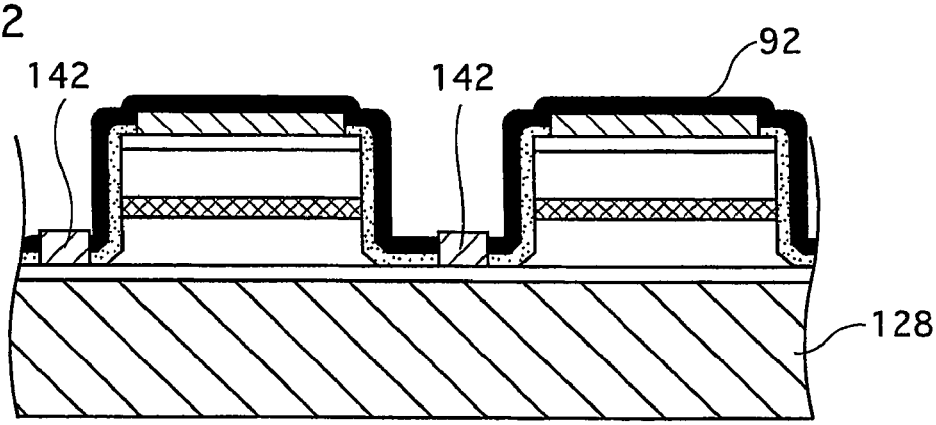
Figure 7:
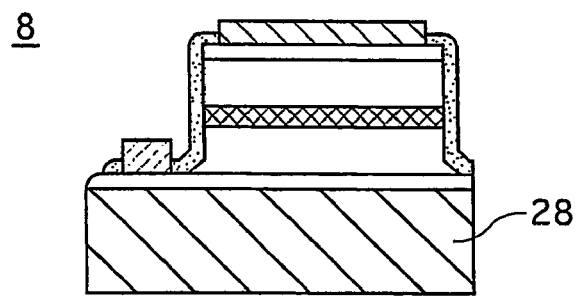

The following part describes a manufacturing method for the red LEDs 8 with reference to FIGS. 6 and 7.

In FIGS. 6 and 7, a material to form each constituent of the red LED 8 is identified by a three-digit number whose first digit is one. The last two digits of the three-digit number represents a reference numeral identifying the corresponding constituent of the red LED 8.

The red LED 8 is manufactured in a method disclosed, for example, in Japanese unexamined patent application publication No. 2001-57441. Firstly, an n-GaInP contact layer 138, an n-AlInP clad layer 136, an AlGaInP MQW light emitting layer 134, a p-AlInP clad layer 132, and a p-GaInP contact layer 130 are formed in the stated order on an n-GaAs substrate 84 using the MOCVD method. The n-GaAs substrate 84 is used to achieve lattice matching easily. After this, a p-InP substrate 128, which transmits red light, is adhered to a surface of the p-GaInP contact layer 130. The n-GaAs substrate 84, which absorbs red light, is removed (step A2). Here, the p-InP substrate 128 is 250 μm in thickness.

After this, a mask 86 is formed on a surface of the n-GaInP contact layer 138, to mask an area that is slightly larger than an area in which the Ni/Al electrode 40 of each red LED 8 is to be formed. An unmasked area of the lamination made up of the layers 138 to 132 is removed by etching to such a depth that a surface of the p-GaInP contact layer 130 is exposed (step B2). Thus, a surface to connect the Ti/Al electrode 40 (an electrofe formation surface) is formed. The mask 86 is removed prior to the next step.

An Si₃N₄ film 88, which is an insulating film, is formed on the resulting surface by sputtering or the like for insulation and surface protection (step C2).

A mask 90 is formed, so as to mask the Si₃N₄ film 88, except for an area in which the Ni/Al electrode 40 for each red LED 8 is to be formed. An unmasked area of the Si₃N₄ film 88 is removed by etching. An Ni/Al thin film 140 is then applied by deposition. Thus, the Ni/Al electrode 40 is formed (step D2). A portion of the Ni/Al thin film 140 which is formed on the mask 90 (not shown in FIG. 7) is removed together with the mask 90 prior to the next step.

The same procedure as the step D2 is performed to form the Ni/Au electrode 42 for each red LED 8. Specifically speaking, a mask 92 is formed so as to mask the resulting surface after the step D2, except for an area on the Si₃N₄ film 88 in which the Ni/Au electrode 42 for each red LED 8 is to be formed. An unmasked area of the Si₃N₄ film 88 is removed by etching. An Ni/Au film 142, which is a thin metal film, is then applied by deposition, to form the Ni/Au electrode 42 (step E2). A portion of the Ni/Au film 142 which is formed on the mask 92 (not shown in FIG. 7) is removed together with the mask 92 prior to the next step.

A lower surface of the p-InP substrate 128 is polished, so that the thickness of the p-InP substrate 128 becomes 100 μm. Lastly, the p-InP substrate 128 is divided into individual red LEDs 8 by dicing. Thus, the red LEDs 8 are manufactured (step F2).

Figure 8:
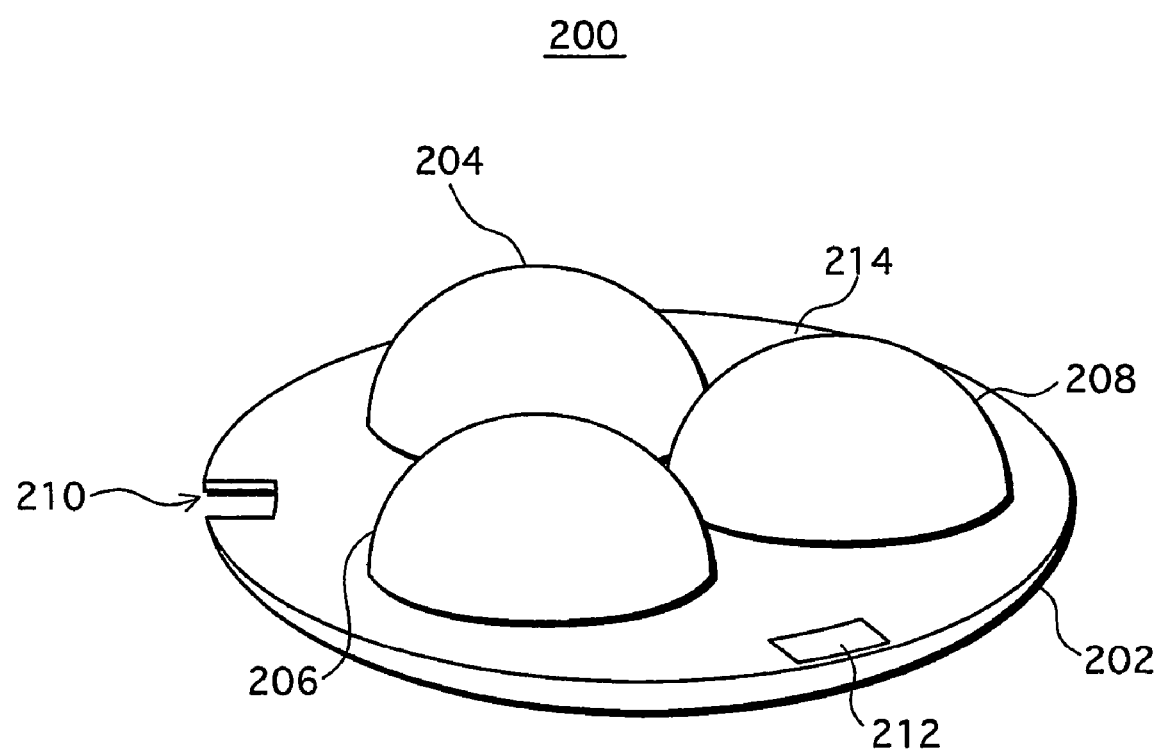
FIG. 8 is a perspective view illustrating an LED module.

FIG. 8 is an external perspective view illustrating a white LED module 200 including LED array chips 2 described above (hereinafter simply referred to as "an LED module 200"). The LED module 200 is attached to a lighting unit 240 (shown in FIGS. 11A and 11B and mentioned later).

The LED module 200 includes the ceramics substrate 202 that is in a shape of a circle having a diameter of 5 cm and is made of aluminum nitride (AlN) and three lenses 204, 206 and 208 made of glass. A guiding depression 210 used to attach the LED module 200 to the lighting unit 240 and terminals 212 and 214 to receive a power supply from the lighting unit 240 are provided in the ceramics substrate 202. Other than AlN, the ceramics substrate 202 can be made of Al₂O₃, BN, MgO, ZnO, SiC or diamond.

Figure 9A:
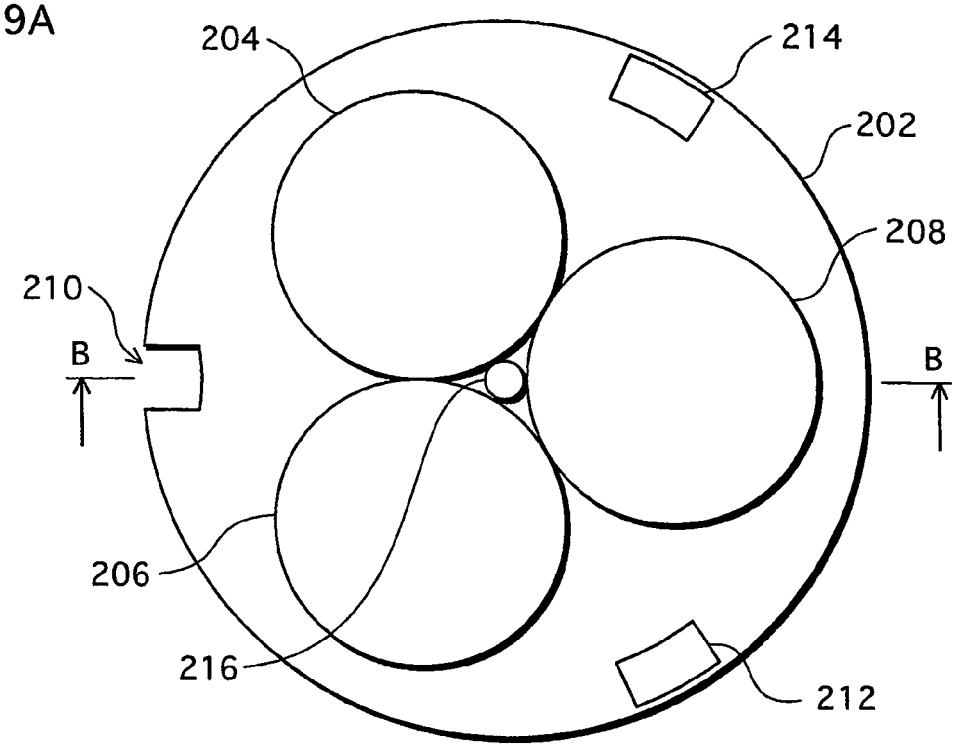
FIG. 9A is a plan view illustrating the LED module.
Figure 9B:
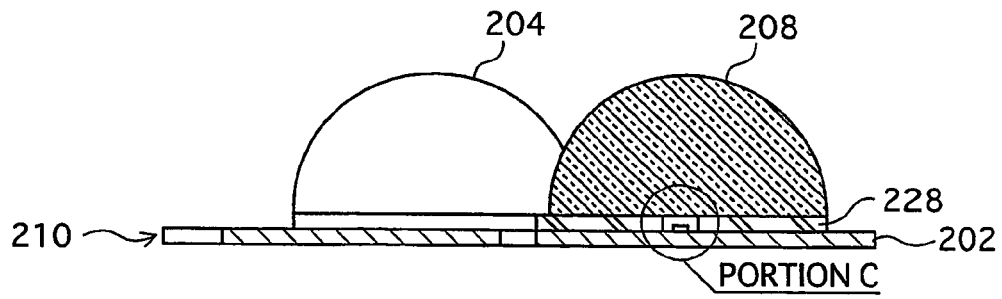
FIG. 9B illustrates a cross-section along a line BB shown in FIG. 9A.
Figure 9C:
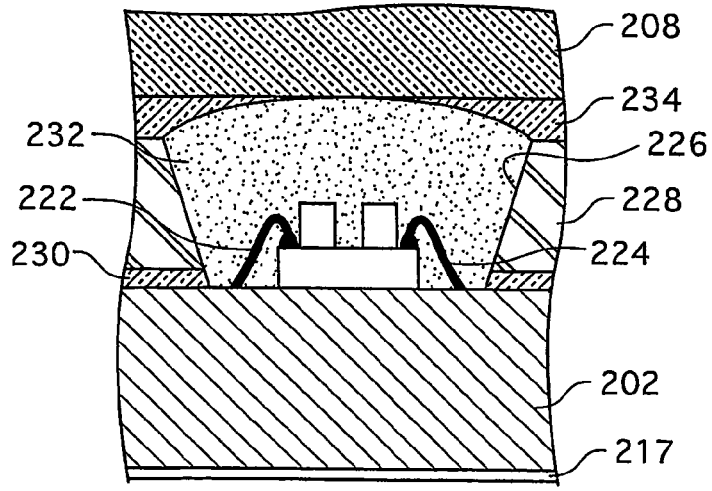
FIG. 9C is an enlargement view illustrating a portion C shown in FIG. 9B.

FIG. 9A is a plan view illustrating the LED module 200, FIG. 9B illustrates a cross-section of the LED module 200 along a line BB shown in FIG. 9A, and FIG. 9C is an enlargement view illustrating a portion C shown in FIG. 9B.

As shown in FIGS. 9A and 9B, a guiding hole (a through hole) 216 is provided in the center of the ceramics substrate 202 to attach the LED module 200 to the lighting unit 240. As shown in FIG. 9C, a gold plating 217 is applied to a lower surface of the ceramics substrate 202 for improving heat dissipation.

The LED array chip 2 is mounted at a location, on an upper surface of the ceramics substrate 202, corresponding to a center of each of the lenses 204, 206 and 208 having a shape of a circle as shown in FIG. 9A. In total, three LED array chips 2 are mounted on the ceramics substrate 202.

A cathode pad used for chip mounting 218 (hereinafter simply referred to as "a cathode pad 218") and an anode pad 220 (shown in FIG. 10B) are provided at the location, on the upper surface of the ceramics substrate 202, where each LED array chip 2 is to be mounted. Each of the cathode pad 218 and the anode pad 220 is made up of nickel (Ni) plating and then gold (Au) plating applied on copper (Cu). The LED array chip 2 is mounted to the cathode pad 218 using solder in such a manner that the SiC substrate 4 is adhered to the cathode pad 218. Here, a gold bump or a silver paste may be used instead of the solder.

After the LED array chip 2 is mounted in the above manner, the anode electrode and the cathode electrode of the LED array chip 2 are respectively connected to the anode pad 220 and the cathode pad 218 by means of a bonding wire 222 and a bonding wire 224, as shown in FIG. 9C.

Aluminum boards 228 are adhered to an insulating resin layer 230 formed on the upper surface of the ceramics substrate 202. The aluminum boards 228 are 0.5 mm in thickness, and have a shape of a circle having the same diameter as the lenses 204, 206 and 208. Here, each aluminum board 228 has a taper reflection hole 226 that is provided so as to correspond to the location where the LED array chip 2 is mounted. The reflection hole 226 is provided in the center of the circular aluminum board 228, and has a diameter of 3 mm at its lower side and a diameter of 4 mm at its upper side. A slope (wall) of the downward taper reflection hole 226 is a mirror-like surface, so as to function as a reflection mirror.

Each LED array chip 2 has a phosphor dispersed member 232, which is provided after the LED array chip 2 is mounted on the upper surface of the ceramics substrate 202. The phosphor dispersed member 232 is made of silicone resin in which particles of a green-yellow phosphor $(Sr, Ba)_2SiO_4:Eu^{2+}$ and ultrafine particles of $SiO_2$ are dispersed. The phosphor dispersed member 232 is formed by filling the reflection hole 226 with this silicone resin. The phosphor dispersed member 232 converts part of blue light emitted from the LED array chip 2 into green-yellow light. The green-yellow light, the blue light and red light diffuse and mix together, to generate white light. When compared with a YAG phosphor, the phosphor $(Sr, Ba)_2SiO_4:Eu^{2+}$ has a higher dispersibility within a silicone resin, and therefore can disperse evenly within the silicone resin. Accordingly, not only the blue light and the red light mix together better, but also the green-yellow light and the blue and red light mix together better. As a consequence, white light with little unevenness of color can be generated.

Each of the lenses 204, 206 and 208 is adhered to the aluminum board 228 using an adhesive agent 234. The adhesive agent 234 may be, for example, silicone resin or epoxy resin.

The three LED array chips 2 are connected in parallel by a wiring pattern formed on the upper surface of the ceramics substrate 202.

Figure 10A:
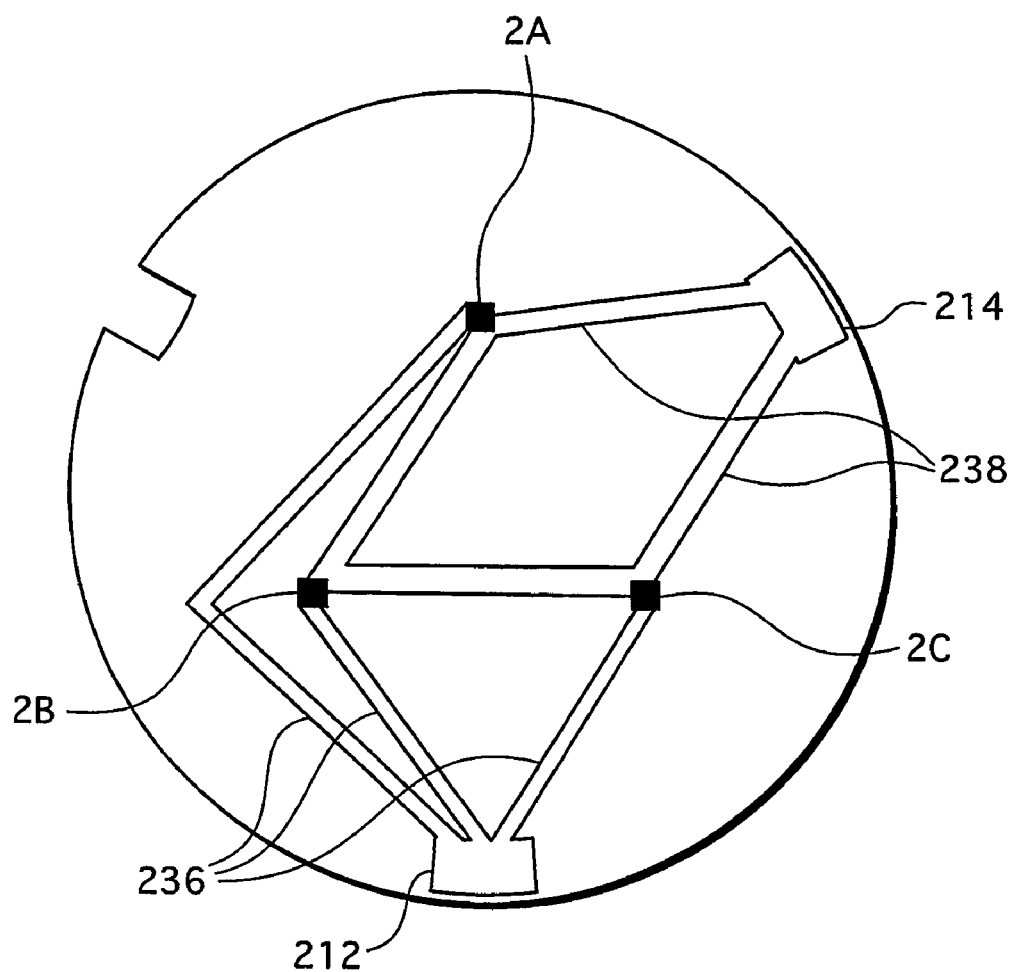
Figure 10B:
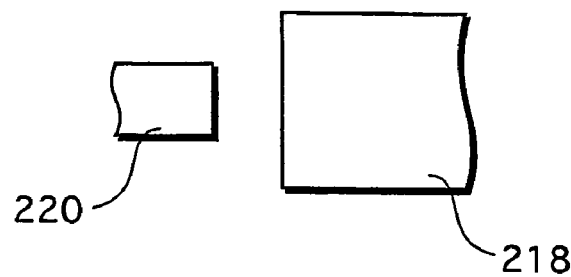
FIG. 10B illustrates a pad pattern formed on a ceramics substrate included in the LED module.

FIG. 10A is a plan view illustrating the LED module 200 after removing the lenses 204, 206 and 208, the three aluminum boards 228 and the insulating resin layer 230. In FIG. 10A, the three LED array chips 2 are distinguished from each other by addition of marks of A, B and C.

As described above, the anode pad 220 and the cathode pad 218 (FIG. 10B) are printed at the location, on the upper surface of the ceramics substrate 202, where each of the LED array chips 2A, 2B and 2C is mounted.

The anode pads 220 that are respectively connected to the LED array chips 2A, 2B and 2C are electrically connected to each other by a wiring pattern 236. The wiring pattern 236 is connected to the positive terminal 212 at its end. The cathode pads 218 that are respectively connected to the LED array chips 2A, 2B and 2C are electrically connected to each other by a wiring pattern 238. The wiring pattern 238 is connected to the negative terminal 214 at its end. In other words, the LED array chips 2A, 2B and 2C are connected in parallel by the wiring patterns 236 and 238.

The LED module 200 having the above-described construction is attached to the lighting unit 240. The LED module 200 and the lighting unit 240 constitute a lighting apparatus 242 (mentioned later).

Figure 11A:
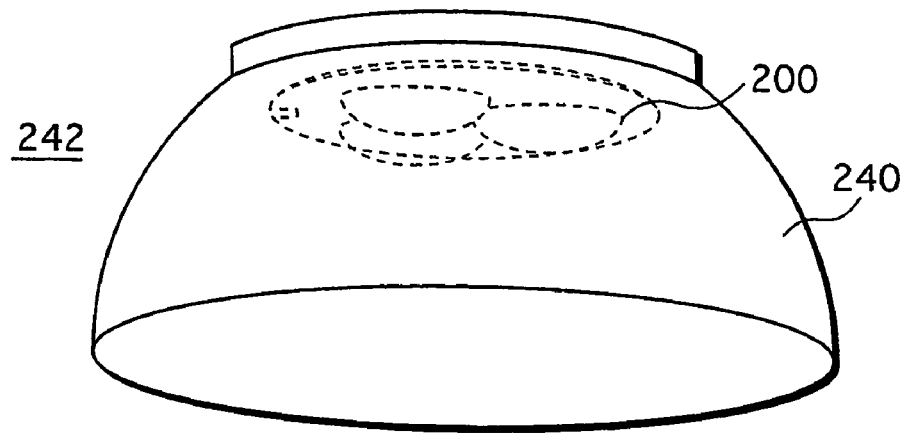
FIG. 11A is a perspective view illustrating a lighting apparatus.
Figure 11B:
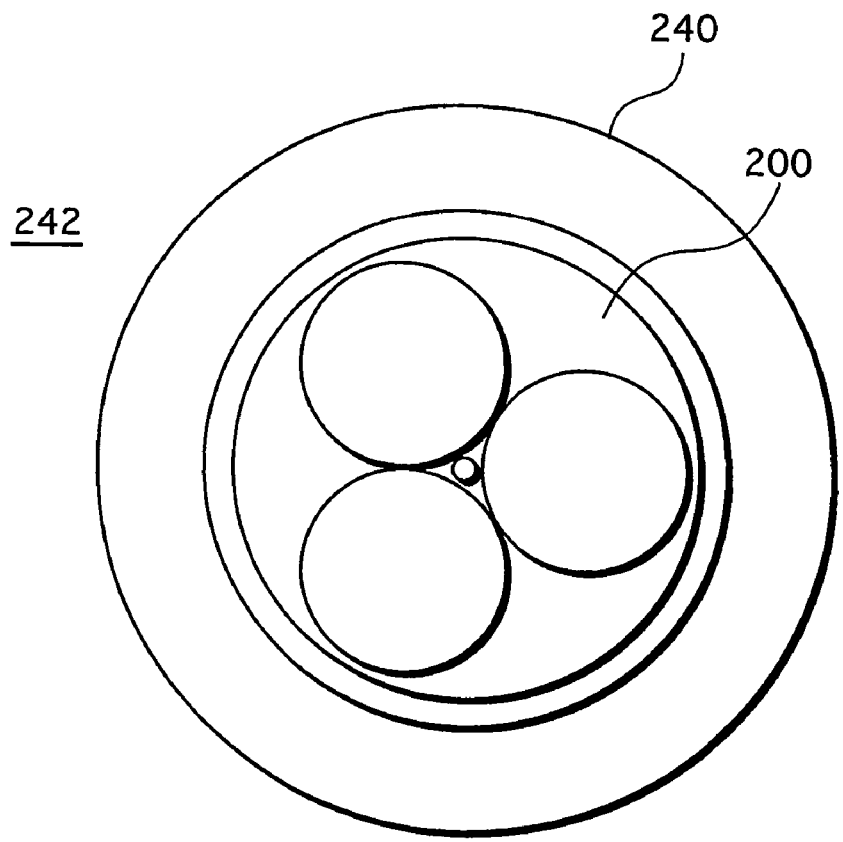
FIG. 11B is a bottom plan view illustrating the lighting apparatus.

FIG. 11A is a schematic perspective view illustrating the lighting apparatus 242, and FIG. 11B is a bottom plan view illustrating the lighting apparatus 242.

The lighting unit 240 is, for example, fixed on a ceiling of a room. The lighting unit 240 includes a power supply circuit (not shown in FIGS. 11A and 11B) that converts alternating-current power (e.g. 100 V, 50/60 Hz) supplied from a commercial power source into direct-current power required for driving the LED module 200.

Figure 12:
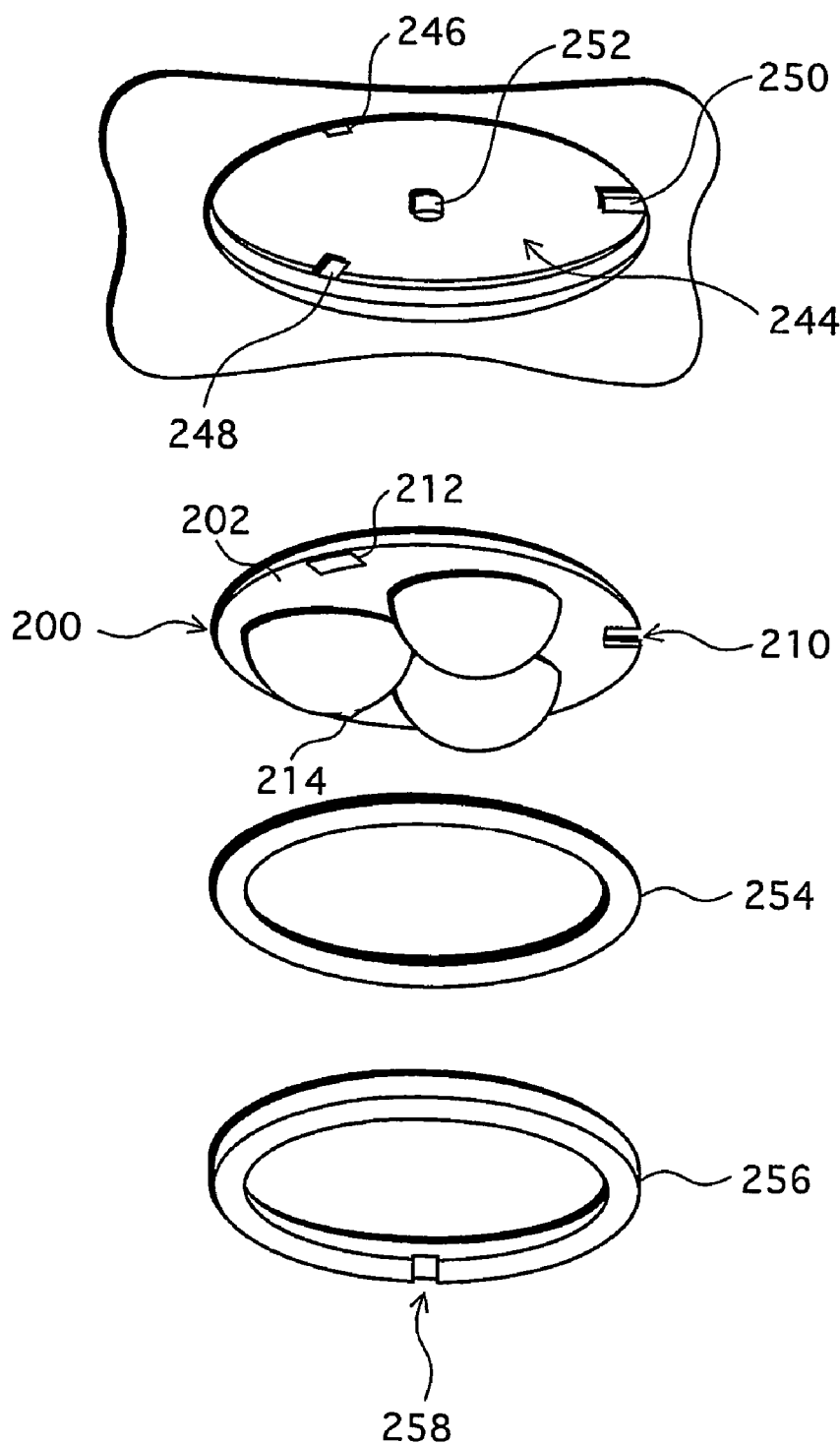
FIG. 12 is a perspective view illustrating each constituent of the lighting apparatus.

The following part describes a construction to attach the LED module 200 to the lighting unit 240, with reference to FIG. 12.

The lighting unit 240 has a circular depression 244 in which the LED module 200 is to be fitted. A bottom surface of the circular depression 244 is flat. An internal thread (not shown in FIG. 12) is created, in the vicinity of an open end of the circular depression 244, on an inside wall of the circular depression 244. Flexible power supply terminals 246 and 248 and a guiding protrusion 250 protrude from the inside wall of the circular depression 244, between the internal thread and the bottom surface of the circular depression 244. The power supply terminals 246 and 248 are respectively positive and negative. A guiding pin 252 is provided in the center of the bottom surface of the circular depression 244.

An O-ring 254 made of silicon rubber and a ring screw 256 are used to attach the LED module 200 to the lighting unit 240. The ring screw 256 has a shape of a ring that has a substantially rectangular cross-section. An external thread (not shown in FIG. 12) is created on an outer surface of the ring screw 256, and a depression 258 is provided.

The following part describes a procedure of attaching the LED module 200 to the lighting unit 240.

To start with, the LED module 200 is fitted in the circular depression 244 in the following manner. The ceramics substrate 202 of the LED module 200 is positioned between the bottom surface of the circular depression 244 and the power supply terminals 246 and 248. The guiding pin 252 is fitted in the guiding hole 216, so as to align the center of the LED module 200 with the center of the circular depression 244. Furthermore, the guiding protrusion 250 is fitted in the guiding depression 210, so as to align the positive and negative terminals 212 and 214 with the power supply terminals 246 and 248 respectively.

After the LED module 200 is fitted in the circular depression 244, the ring screw 256 to which the O-ring 254 has been attached is screwed into the circular depression 244 and fixed. Thus, the positive and negative terminals 212 and 214 are respectively connected to the power supply terminals 246 and 248, so that the terminals 212 and 214 are electrically connected to the terminals 246 and 248 reliably. In addition, the substantially entire lower surface of the ceramics substrate 202 is connected to the flat bottom surface of the circular depression 244. This enables heat generated in the LED module 200 to be effectively conducted to the lighting unit 240, thereby improving a cooling effect of the LED module 200. Here, silicone grease may be applied to the lower surface of the ceramics substrate 202 and the bottom surface of the circular depression 244 to further improve the heat conduction efficiency from the LED module 200 to the lighting unit 240.

When power is supplied to this lighting apparatus 242 from a commercial power source, the blue LEDs 6 emit blue light, and the red LEDs 8 emit red light in each LED array chip 2. Here, part of the blue light is converted into green-yellow light by the phosphor within the phosphor dispersed member 232 as described above. The blue light, the red light and the green-yellow light diffuse and mix together in the phosphor dispersed member 232, to generate white light. The white light is emitted through the lenses 204, 206 and 208.

Figure 13:
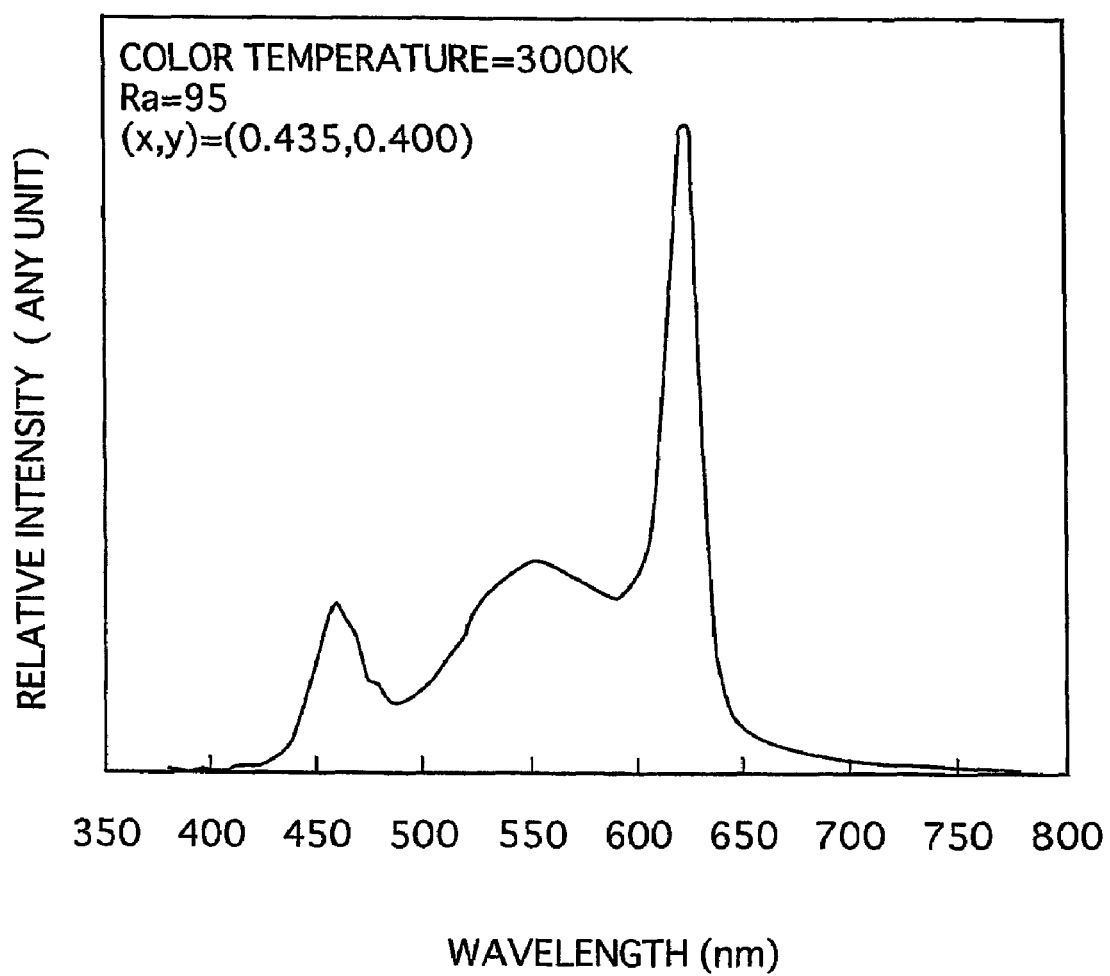
FIG. 13 illustrates an emission spectrum of the lighting apparatus.
Figure 14A:
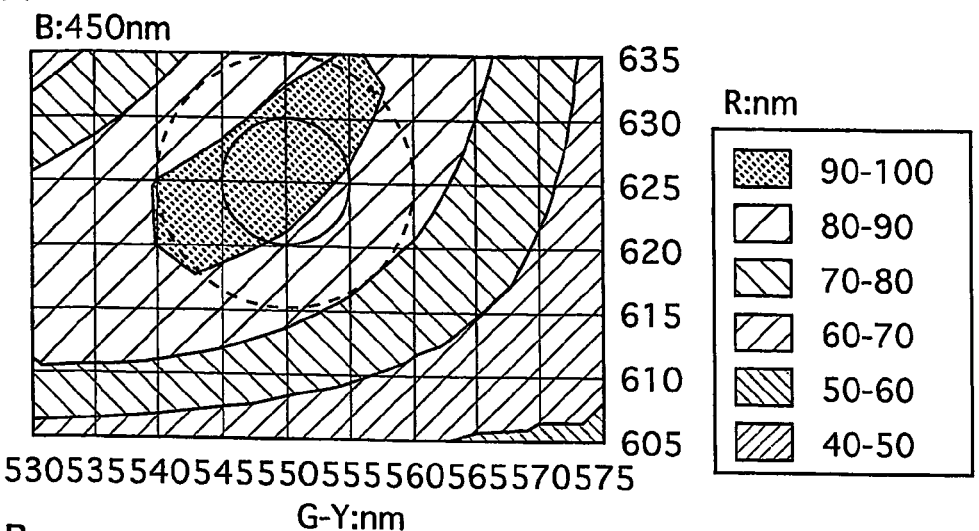
FIG. 14 maps a general color rendering index Ra at a color temperature of 3000K, based on a peak emission wavelength of each of the red LED and a green-yellow phosphor, for each different peak emission wavelength of a blue LED.
Figure 14B:
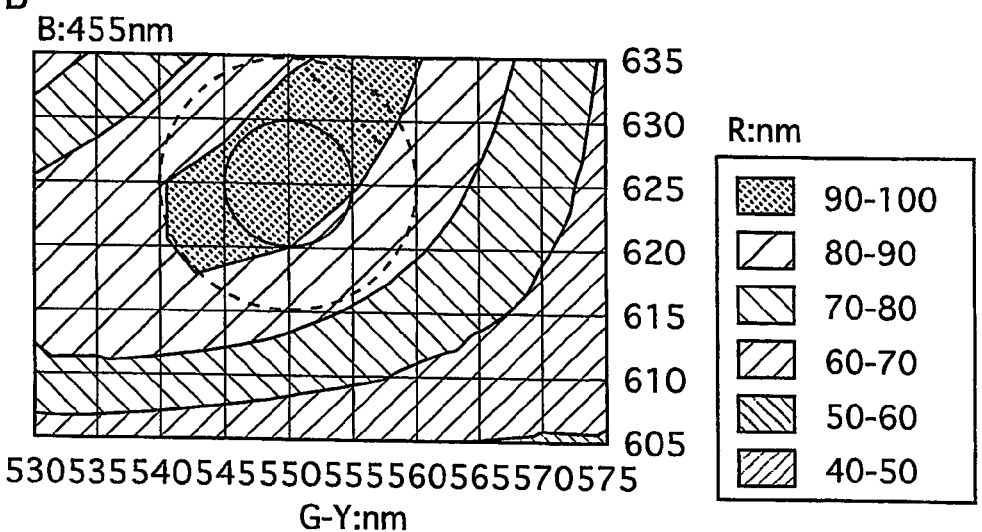
Figure 14C:
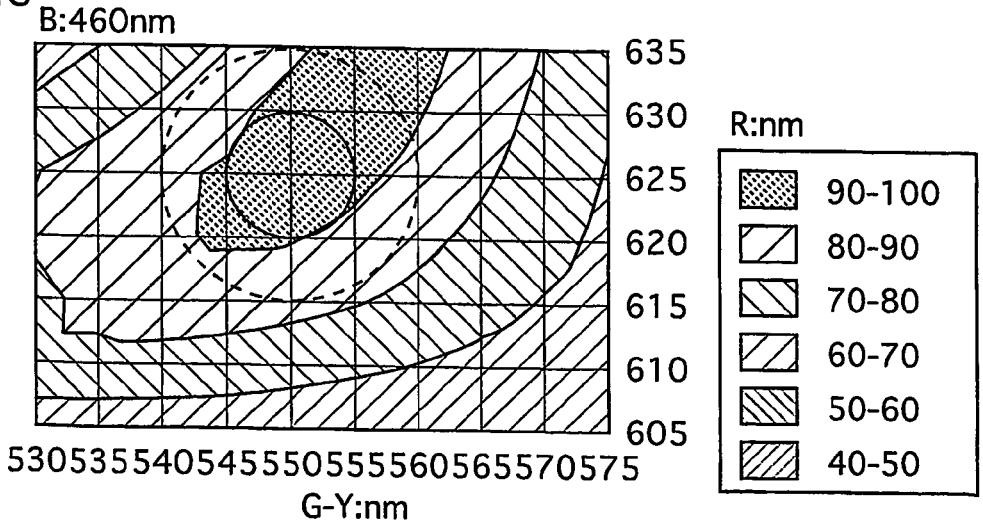
Figure 14D:
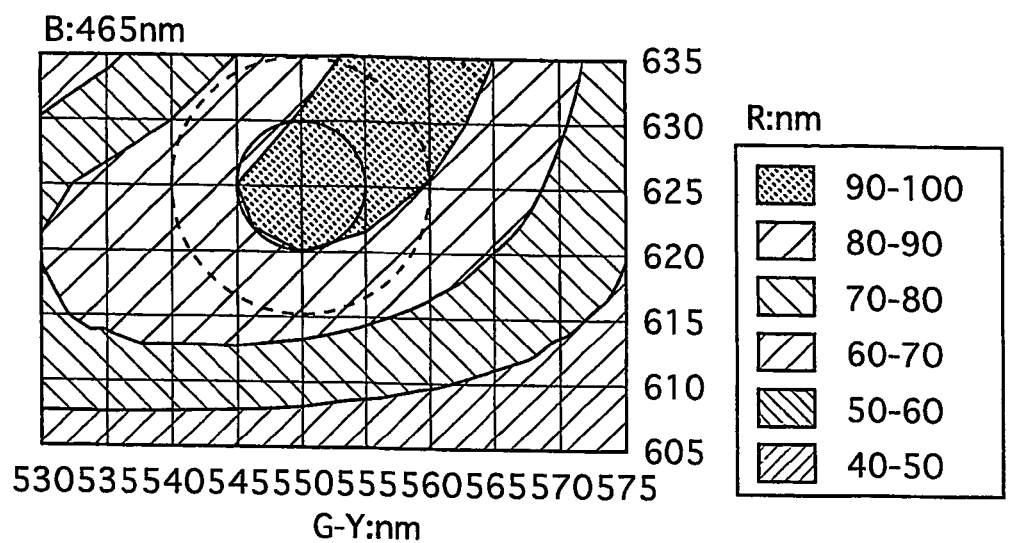
Figure 14E:
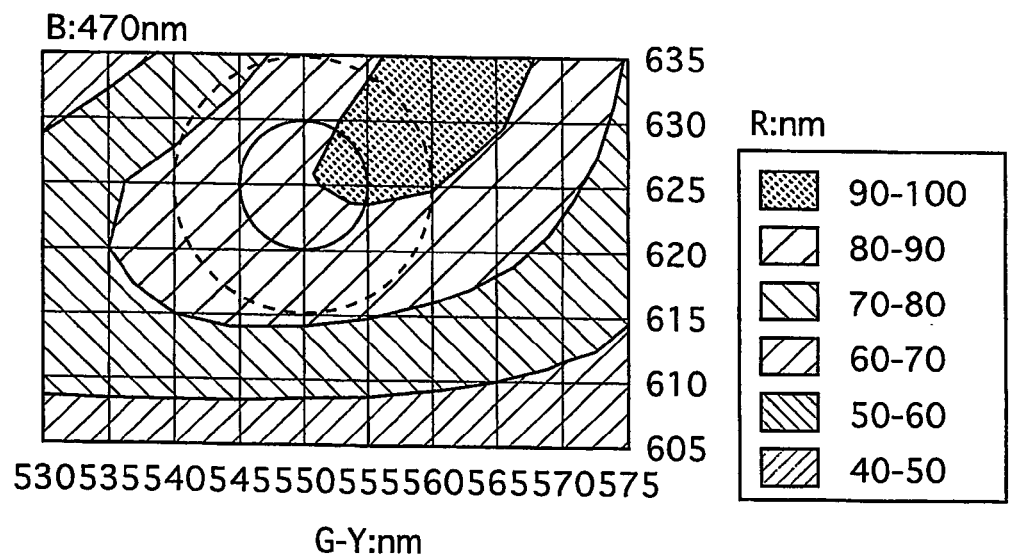

When an electric current of 150 mA is applied to the LED module 200, a total luminous flux of 800 lm, an on-axis luminous intensity of 1600 cd, and an emission spectrum shown in FIG. 13 are observed. The lighting apparatus 242 relating to the present embodiment achieves a color temperature of 3000K, chromaticity coordinates (x, y) of (0.435, 0.400), and a general color rendering index Ra of 95. Thus, the lighting apparatus 242 achieves a low color temperature and excellent color rendering, which can not be achieved by conventional white LEDs.

Here, the general color rendering index Ra is determined by a peak emission wavelength of each of the blue LED 6, the red LED 8, and the green-yellow phosphor. Accordingly, the general color rendering index Ra can be adjusted by changing a peak emission wavelength of each of the blue LED 6, the red LED 8, and the green-yellow phosphor. The peak emission wavelengths of the blue and red LEDs 6 and 8 can be altered by changing a thickness and a composition ratio of the MQW light emitting layers 16 and 34. The peak emission wavelength of the green-yellow phosphor can be altered by changing its composition ratio.

FIG. 14 maps the general color rendering index Ra at a color temperature of 3000K, based on the peak emission wavelength of the red LED 8 (R) and the peak emission wavelength of the green-yellow phosphor (G-Y), when the peak emission wavelength of the blue LED 6 (B) is 450, 455, 460, 465 or 470 nm.

In each of FIGS. 14A, 14B, 14C, 14D and 14E, an area within a solid circle achieves a general color rendering index Ra of approximately 90 or over. Specifically speaking, the general color rendering index Ra of 90 or over can be achieved when the peak emission wavelength of the blue light is within a range of 455 nm and 465 nm, the peak emission wavelength of the red light is within a range of 620 nm and 630 nm, and the peak emission wavelength of the green-yellow light is within a range of 545 nm and 555 nm.

In each of FIGS. 14A, 14B, 14C, 14D and 14E, an area within a dashed circle achieves a general color rendering index Ra of approximately 80 or over. Specifically speaking, the general color rendering index Ra of 80 or over can be achieved when the peak emission wavelength of the blue light is within a range of 450 nm and 470 nm, the peak emission wavelength of the red light is within a range of 615 nm and 635 nm, and the peak emission wavelength of the green-yellow light is within a range of 540 nm and 560 nm.

These ranges for the peak emission wavelengths can be achieved without reducing the productivity of the manufacturing process for the red and blue LEDs 6 and 8 and the green-yellow phosphor. Also, these ranges are applicable when a YAG phosphor is used instead of a silicate phosphor for the green-yellow phosphor.

It should be noted that the present invention is not limited to the above-described embodiment. The present invention includes the following modification examples.

(1) According to the present embodiment, the blue LEDs 6 are formed by epitaxial growth on the substrate 104. The red LEDs 8 are separately manufactured by epitaxial growth on the substrate 128, which is different from the substrate 104, and then mounted on the substrate 104. Here, the reverse is possible. Which is to say, the red LEDs 8 may be formed by epitaxial growth on the substrate 104. The blue LEDs 6 may be separately manufactured, and then mounted on the substrate 104.

(2) According to the present embodiment, it is only one type of LEDs (the red LEDs 8) which are mounted on the substrate 104. However, another type of LEDs emitting light of a different color, for example, green LEDs may be also mounted. To be more specific, red LEDs 8 in the second, fourth and sixth rows in the LED array chip 2 in FIGS. 1A and 1B may be replaced with green LEDs. If such is the case, a white LED can be realized without using a phosphor. When green LEDs are used, the phosphor dispersed member 232 may be preferably replaced with a light diffusion member, so that the three colors of light mix together better and unevenness of color is further reduced. The light diffusion member can be formed by mixing an alumina powder or the like with silicone resin.

(3) According to the present embodiment, the LED array chip 2 includes 35 LEDs 6 and 8. However, the present invention is not limited thereto. The present invention is applicable to an LED array chip, which is a semiconductor light emitting device, including two or more (types of) LEDs.

According to the present embodiment, the plurality of LEDs 6 and 8 are arranged in a matrix, but the present invention is not limited to such.

(4) According to the present embodiment, all of the LEDs 6 and 8 in the LED array chip 2 are connected in series, but may be connected in parallel or series-parallel. To achieve a series-parallel connection, the LEDs 6 and 8 are divided into several groups. Then, LEDs in each group are connected in series, and the groups are connected in parallel.

(5) According to the present embodiment, the blue LEDs 6 are formed on the non-doped SiC substrate 104, which is a highly-resistive semiconductor substrate. However, the present invention is not limited thereto. The blue LEDs 6 may be formed on a sapphire substrate, which is one type of an insulating substrate, an AlN substrate, or an electrically conductive substrate with a highly-resistive AlGaN layer or the like. Such electrically conductive substrate may be an SiC, GaN or Si substrate.

(6) According to the present embodiment, the lenses 204, 206 and 208 are made of glass, but may be made of resin, for example, epoxy resin.

INDUSTRIAL APPLICABILITY

A semiconductor light emitting device relating to an embodiment of the present invention is applicable, for example, for a lighting apparatus that requires little unevenness of color.

The invention claimed is:

1. A semiconductor light emitting device comprising:
a substrate;
a plurality of semiconductor blue-light emitting elements each having an epitaxial structure on the substrate;
a plurality of semiconductor red-light emitting elements that have been mounted on an electrically conductive pattern provided on the substrate; and
a phosphor that covers the semiconductor blue-light emitting elements and the semiconductor red-light emitting elements, wherein
each semiconductor red-light emitting element has been flip-chip mounted via at least one bump,
a vertical height of each semiconductor red-light emitting element from a main surface of the substrate is greater than a vertical height of each semiconductor blue-light emitting element from the main surface of the substrate, and
the semiconductor red-light emitting elements and the semiconductor blue-light emitting elements are arranged in a matrix, in such a manner that each semiconductor red-light emitting element is adjacent to semiconductor blue-light emitting elements in both row and column directions, except for some of the semiconductor blue-light emitting elements which are at corners of the substrate.

2. The semiconductor light emitting device of claim 1, wherein each semiconductor blue-light emitting element comprises a blue LED, and each semiconductor red-light emitting element comprises a red LED, and the phosphor converts blue light emitted by the blue LEDs into green-yellow light.

3. The semiconductor light emitting device of claim 2, wherein red light, which is emitted by the red LEDs, has a peak emission wavelength within a range of 615 nm and 635 nm, the blue light has a peak emission wavelength within a range of 450 nm and 470 nm, and the green-yellow light has a peak emission wavelength within a range of 540 nm and 560 nm.

4. The semiconductor light emitting device of claim 3, wherein the red light has a peak emission wavelength within a range of 620 nm and 630 nm, the blue light has a peak emission wavelength within a range of 455 nm and 465 nm, and the green-yellow light has a peak emission wavelength within a range of 545 nm and 555 nm.

5. The semiconductor light emitting device of claim 2, wherein the phosphor is a silicate phosphor $(Ba, Sr)_2SiO_4:Eu^{2+}$.

6. The semiconductor light emitting device of claim 2, wherein the substrate is made of one of SiC and AlN materials.

7. The semiconductor light emitting device of claim 2, further comprising:

a wiring pattern that electrically connects the blue LEDs and the red LEDs together.

8. The semiconductor light emitting device of claim 7, wherein the wiring pattern connects the blue LEDs and the red LEDs together in series.

9. A light emitting module comprising:

a printed-wiring board; and a semiconductor light emitting device including:

a substrate;

a plurality of semiconductor blue-light emitting elements each having an epitaxial structure on the substrate;

a plurality of semiconductor red-light emitting elements that have been mounted on an electrically conductive pattern provided on the substrate; and a phosphor that covers the semiconductor blue-light emitting elements and the semiconductor red-light emitting elements, wherein each semiconductor red-light emitting element has been flip-chip mounted via at least one bump, a vertical height of each semiconductor red-light emitting element from a main surface of the substrate is greater than a vertical height of each semiconductor blue-light emitting element from the main surface of the substrate, and the semiconductor red-light emitting elements and the semiconductor blue-light emitting elements are arranged in a matrix, in such a manner that each semiconductor red-light emitting element is adjacent to semiconductor blue-light emitting elements in both row and column directions, except for some of the semiconductor blue-light emitting elements which are at corners of the substrate.

10. The light emitting module of claim 9, further comprising:

a lighting apparatus including a closed structure in which the light emitting module is disposed.

11. The light emitting module of claim 9, wherein each semiconductor blue-light emitting element comprises a blue LED, and each semiconductor red-light emitting element comprises a red LED, and the phosphor converts blue light emitted by the blue LEDs into green-yellow light.

12. The light emitting module of claim 11, wherein red light, which is emitted by the red LEDs, has a peak emission wavelength within a range of 615 nm and 635 nm, the blue light has a peak emission wavelength within a range of 450 nm and 470 nm, and the green-yellow light has a peak emission wavelength within a range of 540 nm and 560 nm.

13. The light emitting module of claim 11, wherein the red light has a peak emission wavelength within a range of 620 nm and 630 nm, the blue light has a peak emission wavelength within a range of 455 nm and 465 nm, and the green-yellow light has a peak emission wavelength within a range of 545 nm and 555 nm.

14. The light emitting module of claim 11, wherein the phosphor is a silicate phosphor $(Ba, Sr)_2SiO_4:Eu^{2+}$.

15. The light emitting module of claim 9, wherein the substrate is made of one of SiC and AlN materials.

16. The light emitting module of claim 9, further comprising:

a wiring pattern that electrically connects the blue LEDs and the red LEDs together.

17. The light emitting module of claim 16, wherein the wiring pattern connects the blue LEDs and the red LEDs together in series.

18. A method for manufacturing a semiconductor light emitting device comprising:

providing a substrate;

growing a plurality of semiconductor blue-light emitting elements on the substrate with an epitaxial structure;

providing a plurality of semiconductor red-light emitting elements on an electrically conductive pattern provided on the substrate; and providing a phosphor that covers the semiconductor blue-light emitting elements and the semiconductor red-light emitting elements, wherein the semiconductor red-light emitting elements are provided by flip-chip mounting each semiconductor red-light emitting element via at least one bump, a vertical height of each semiconductor red-light emitting element from a main surface of the substrate is greater than a vertical height of each semiconductor blue-light emitting element from the main surface of the substrate, and the semiconductor red-light emitting elements and the semiconductor blue-light emitting elements are arranged in a matrix, in such a manner that each semiconductor red-light emitting element is adjacent to semiconductor blue-light emitting elements in both row and column directions, except for some of the semiconductor blue-light emitting elements which are at corners of the substrate.

19. The method of claim 18, wherein each semiconductor blue-light emitting element comprises a blue LED, and each semiconductor red-light emitting element comprises a red LED, and the phosphor converts blue light emitted by the blue LEDs into green-yellow light.

20. The method of claim 18, further comprising:

forming a wiring pattern that electrically connects the blue LEDs and the red LEDs together.

* * * * *